United States Patent [19]

Tada et al.

[11] Patent Number: 5,302,892
[45] Date of Patent: Apr. 12, 1994

[54] SEMICONDUCTOR INTEGRATED CIRCUIT

[75] Inventors: Masashige Tada; Takehiko Umeyama, both of Itami, Japan

[73] Assignee: Mitsubishi Denki Kabushiki Kaisha, Tokyo, Japan

[21] Appl. No.: 885,638

[22] Filed: May 19, 1992

[30] Foreign Application Priority Data

Sep. 12, 1991 [JP] Japan .................................. 3-232859

[51] Int. Cl.⁵ ............................................. G01R 31/28
[52] U.S. Cl. ................................ 324/158 R; 324/73.1
[58] Field of Search .............. 324/158 R, 158 T, 73.1;
371/15.1, 22.6, 22.3, 22.1; 307/303.1; 437/8;
257/48

[56] References Cited

U.S. PATENT DOCUMENTS

| | | | |
|---|---|---|---|
| 4,697,095 | 9/1987 | Fujii | 324/158 T |
| 4,942,358 | 7/1990 | Davis et al. | 324/158 R |

FOREIGN PATENT DOCUMENTS

56-57136  5/1981  Japan .

*Primary Examiner*—Vinh Nguyen
*Attorney, Agent, or Firm*—Oblon, Spivak, McClelland, Maier & Neustadt

[57] ABSTRACT

An integrated circuit (IC 101) has ECL circuits (E3 to En). Bias current (I3) applied to the ECL circuit (E3) is fed by a current mirror circuit consisting of transistors (Q3 and Q1) and resistors (R2 and R3). Constant current (IO) flows in the transistor (Q1) by a constant current circuit (4). The transistor (Q1) has its collector connected to one end of a resistor (R1), the other end of which is connected to a test terminal (2). With an outside resistor (Rb) connected to the test terminal (2) of the integrated circuit (IC 101), part of the constant current (IO) is pulled out to the outside, and the current flowing in the resistor (R2) becomes small. Accordingly, the bias current (I3) is reduced. A voltage difference ΔV of logic states in the ECL circuit (E3) can be controlled from the outside without controlling a temperature, and a test of an inferior transistor the ECL circuit (E3) has can be performed.

33 Claims, 11 Drawing Sheets

SEMICONDUCTOR INTEGRATED CIRCUIT

BACKGROUND OF THE INVENTION

1. Field of the Invention

The present invention relates to an ECL test circuit for easily testing an ECL circuit.

2. Description of the Prior Art

FIG. 8 shows a conventional integrated circuit (IC) 100 having ECL circuits, E3 to En. The IC 100 includes NPN transistors Q3 to Qn for supplying bias currents, I3 to In, to the ECL circuits E3 to En, respectively, while NPN transistors, Q1 and Q2, control values of the bias currents I3 to In. The transistor Q1 has a collector where constant current I0 from a constant current circuit 4 flows. The transistors, Q1 to Qn, together with resistors, R2 to Rn, organize a current mirror circuit, where there are relations expressed as follows:

$$I0 = I3 = \ldots = In \quad (1)$$

FIG. 9 is a circuit diagram showing an inner structure of the IC 100, where merely an ECL circuit E3 and the next stage, an ECL circuit E4, directly connected to the ECL circuit E3, and the surroundings of them are contained.

The ECL circuit E3 is comprised of NPN transistors Q31 and Q32, and a resistor Ro which pulls up collectors of the transistors Q31 and Q32 to a constant voltage Vr.

The ECL circuit E4 is similarly comprised of transistors Q41 and Q42, and the resistor Ro.

FIG. 10 is a wave form diagram showing the operations of the ECL circuits E3 and E4 shown in FIG. 9. When a voltage $Vr - \Delta V$ is applied to an input 1 in the ECL circuit E3 while a voltage Vr is applied to an input 2 of it, voltage at Points a and b become Vr and $Vr - \Delta V$, respectively. In this case, however, there is the relations expressed in the above formula (1), and so, obtained is:

$$\Delta V = Ro \times I0 \quad (2)$$

Voltage of the outputs 1 and 2 are Vr and $Vr - \Delta V$, respectively.

Similarly, when the voltage Vr and $Vr - \Delta V$ are applied to the inputs 1 and 2, respectively, voltage $Vr - \Delta V$ and Vr are generated at the outputs 1 and 2, respectively.

Assume now that the transistor Q32 has some fault, and so, the constant current I1 flows between the collector of the transistor Q32 and the ground GND indifferent to the voltage at the input 2. The voltage of the collector of the transistor Q32 is fixed in $Vr - \Delta Vf$. At this time, however, there is the following relation:

$$\Delta Vf = Ro \times I1 \quad (3)$$

If now the relation $\Delta Vf > \Delta V$ is established, the potential of the base of the transistor Q41 (voltage at Point b) becomes always lower than the voltage of the base of the transistor Q42 (voltage at Point a), voltage at the outputs 1 and 2 cannot be controlled by variations in voltage at the inputs 1 and 2, and this fault can be detected.

As shown in FIG. 11, however, if the relation $\Delta Vf < \Delta V$ is established, the high-low level relation between the voltage at Point a and Point b is reversed in accordance with the variation of the voltage at the inputs 1 and 2, the resultant voltage of the outputs 1 and 2 become identical to the case shown in FIG. 10, and thus, the normal operation can be observed. In other words, no fault can be detected as to the transistor Q32.

Herein the resistor Ro has positive temperature characteristics, and the current I0 generated by the constant current circuit 4 is controlled so as to cancel the characteristics. Therefore, $\Delta V$ has a small dependence upon temperature. Meanwhile $\Delta Vf$ has a large dependence upon temperature because the current I1 is not controlled unlike the current I0, and sometimes $\Delta Vf$ and $\Delta V$ vary in their relative levels if the temperature in testing an ECL circuit is different from the temperature in using it. Thus, sometimes a malfunction during the operation of the transistor Q32 cannot be detected There are various ways of detecting the malfunction through a test: For example, the Voltage Vr at which the transistors Q31, Q32 are pulled up may be varied. However, the voltage Vr determined by the constant voltage circuit 3 inside the IC 100 cannot be easily varied for the test by the external operation outside the IC 100, so the detection of a fault of the transistor Q32 is impossible. Another way is detecting a fault of the transistor Q32 by varying a temperature in testing the ECL circuit, but accurate temperature control is needed during the test.

To sum up, a conventional semiconductor integrated circuit with an ECL circuit has the disadvantage that when some fault of the ECL circuit is externally detected, test stability and efficiency are not good.

SUMMARY OF THE INVENTION

According to the present invention, a semiconductor integrated circuit includes at least one ECL circuit; a current supply circuit for supplying bias current to the ECL circuit; a constant current means in which constant current for controlling the bias current flows; and a test terminal connected to the constant current means for varying a value of the constant current flowing in the constant current means.

Preferably, a number of the at least one ECL circuit is two or more.

Preferably, the constant current means is cooperated with the current supply circuit to organize a current mirror circuit.

Preferably, the constant current means includes a transistor having a first electrode to which a constant current circuit is connected, a second electrode to which a first resistor is connected, and a control electrode to which the current supply circuit is connected.

Preferably, the semiconductor integrated circuit further includes a second resistor connected between the test terminal and the first electrode.

Preferably, the second resistor has a resistance value of zero.

Preferably, a voltage source is to be connected to the test terminal from an outside of the semiconductor integrated circuit.

Preferably, the test terminal is connected to one end of a third resistor, the other end of which is connected to a voltage source.

Preferably, a current source is to be connected to the test terminal from an outside of the semiconductor integrated circuit.

Preferably, the semiconductor integrated circuit further includes a first power source; and a first protective circuit connected between the first power source and the test terminal.

Preferably, the first protective circuit includes a diode.

Preferably, the semiconductor integrated circuit further includes a second power source; and a second protective circuit connected between the second power source and the test terminal.

Preferably, the second protective circuit includes a diode.

Preferably, the semiconductor integrated circuit further includes a second resistor connected between the test terminal and the second electrode.

Preferably, a voltage source is to be connected to the test terminal from an outside of the semiconductor integrated circuit.

Preferably, the test terminal is connected to one end of a third resistor, the other end of which is connected to a voltage source.

Preferably, a current source is to be connected to the test terminal from an outside of the semiconductor integrated circuit.

Preferably, the current supply circuit includes a transistor having a first electrode to which the ECL circuit is connected, a second electrode to which a first resistor is connected, and a control electrode connected to the constant current means.

In the semiconductor integrated circuit according to the present invention, the constant current means enables the bias current in the ECL circuit to vary through the test terminal from the outside of the semiconductor integrated circuit. The test terminal can be connected to the voltage source and current source which supply voltage and current to control the bias current in the ECL circuit.

The semiconductor integrated circuit according to the present invention can allow constant current flowing in a constant current means to be controlled through a test terminal from the outside, and this also allows the bias current applied to each ECL circuit to be controlled. As a result, the ECL circuits can be tested by a simple way, with high accuracy, stably and efficiently.

Accordingly, it is an object of the present invention to provide a semiconductor integrated circuit in which an ECL circuit can be tested stably and efficiently by outside operation.

These and other objects, features, aspects and advantages of the present invention will become more apparent from the following detailed description of the present invention when taken in conjunction with the accompanying drawings.

DESCRIPTION OF THE PREFERRED EMBODIMENT

DETAILED DESCRIPTION OF THE PREFERRED EMBODIMENT FIRST EMBODIMENT

Figure 1:
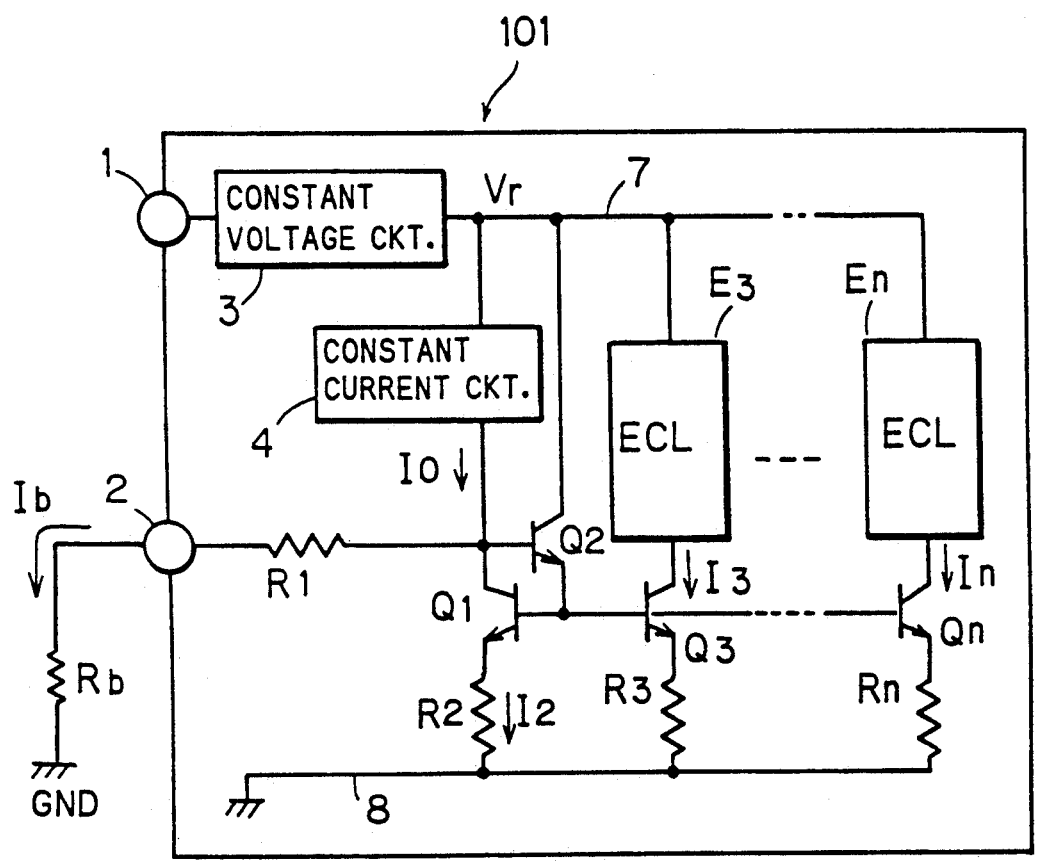
FIG. 1 is a circuit diagram showing a first embodiment accord to the present invention.
Figure 8:
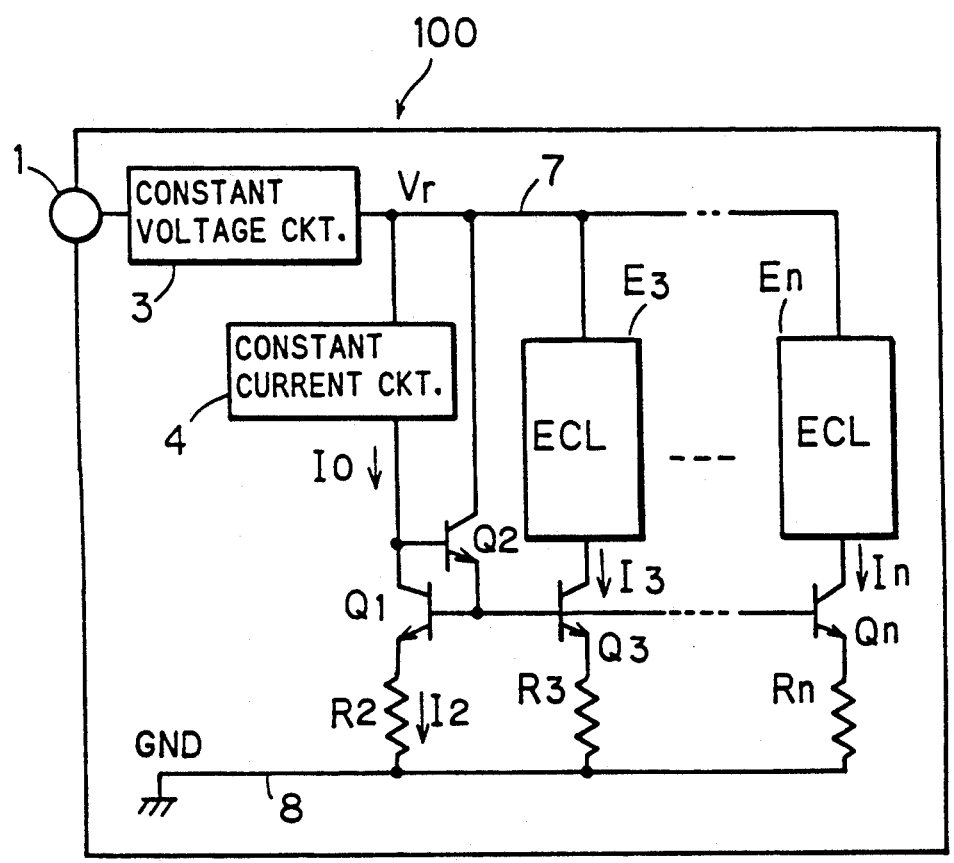
FIG. 8 is a circuit diagram showing an integrated circuit having ECL circuits.
Figure 9:
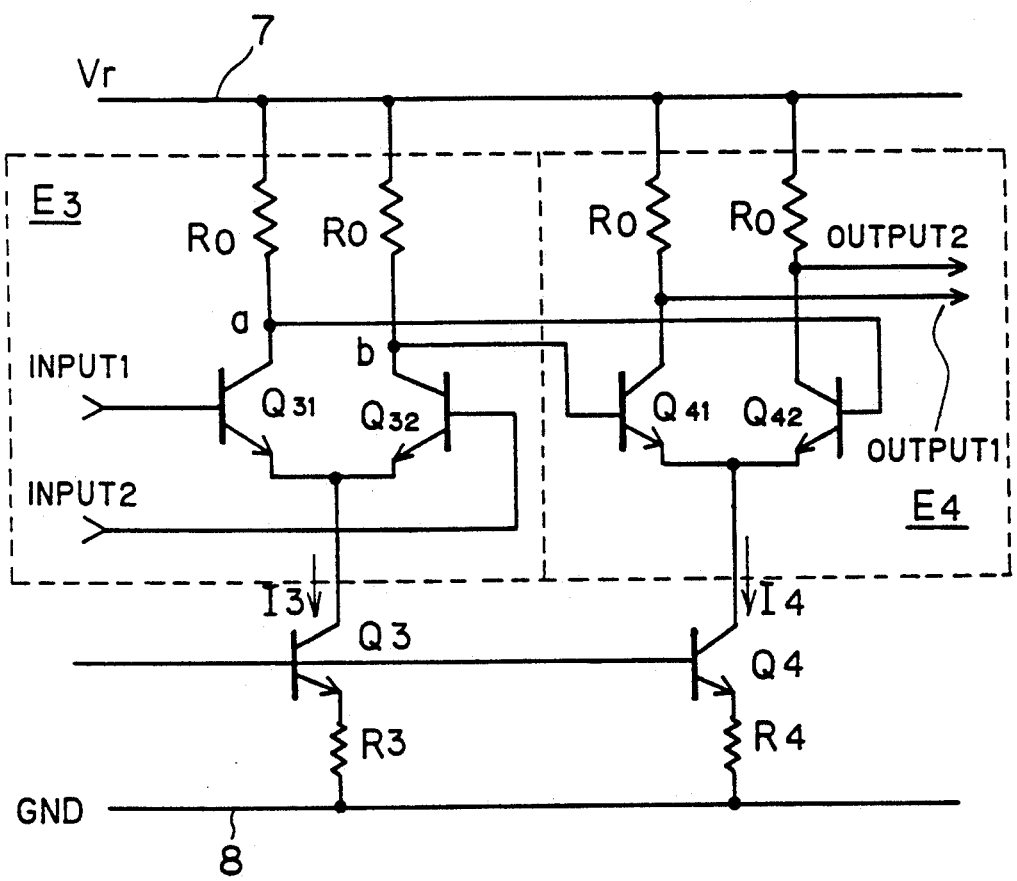
FIG. 9 is a circuit diagram showing the ECL circuits, E3 and E4, and their surroundings.
Figure 10:
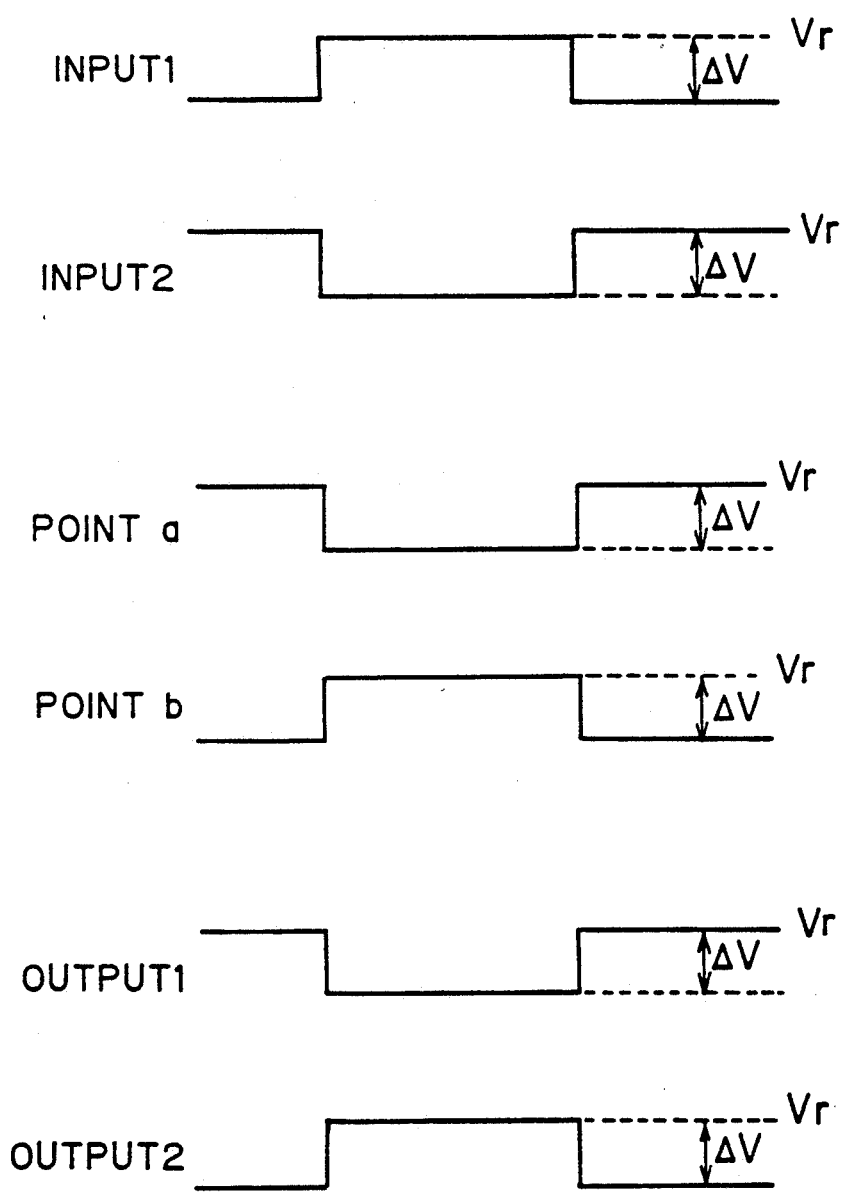
FIG. 10 is a wave form diagram showing the operations of the ECL circuits, E3 and E4.
Figure 11:
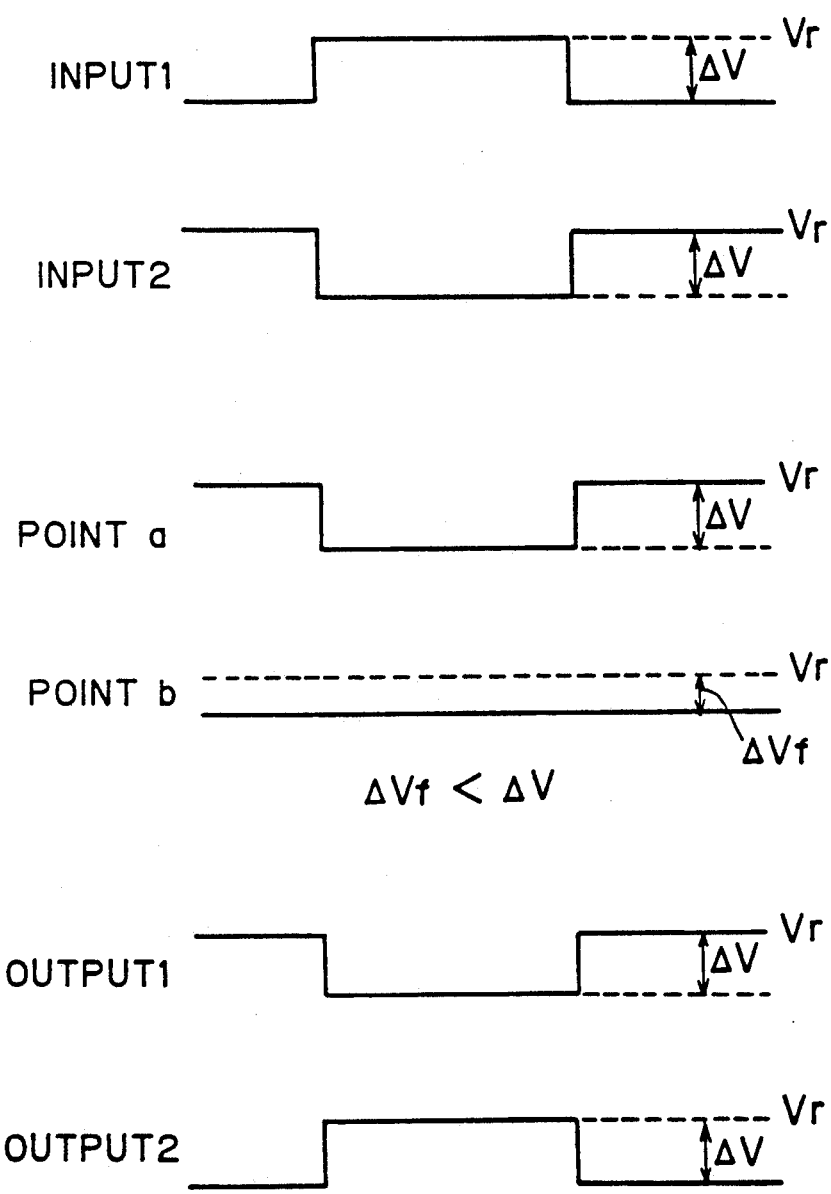
FIG. 11 is a wave form diagram showing the operation of the ECL circuit E3 when it has some fault.

FIG. 1 shows an internal structure of an integrated circuit (IC) 101 having ECL circuits, which is an application of a first embodiment according to the present invention. Similar to the conventional integrated circuit (IC) 100 shown in FIG. 8, the IC 101 has a plurality of ECL circuits, E3 to En, structured as shown in FIG. 9, which are fed with bias currents, I3 to In, respectively, by transistors, Q3 to Qn, which form a current supply circuit for supplying the bids current to the ECL circuits. Transistors Q1 and Qn and resistors R2 to Rn constitute a current mirror circuit, in which a constant current means comprised of the transistors Q1, Q2 and a constant current circuit 4 gives each of the ECL circuits bias current equivalent to the current I2 flowing through the resistor R2 to the ground (GND) 8. On the other hand, constant voltage Vr is applied to each of the ECL circuits by a constant voltage circuit 3. The constant voltage circuit 3 is charged with electric power through a power source terminal 1 from an external power source. Additionally, the transistor Q1 has its collector connected to one end of a resistor R1, the other end of which is connected to a test terminal 2.

A method of testing the ECL circuits of the IC 101 constituted as previously mentioned will be described below. An external resistor Rb has its one end connected to a test terminal 2 from the outside of the IC 101 and the other end to the ground GND, and then, current IO applied by the constant current circuit 4 is divided into current I2 to flow into the collector of the transistor Q1 and current Ib to flow into the resistors R1, Rb connected in serial. At this time, the following relation is established:

$$I2 < IO \qquad (4)$$

Therefore, the bias current of each ECL circuit is decreased compared with the case in which the resistor Rb is not connected, and a difference of two logic states in each ECL circuit $$\Delta V = Ro \times I2 \qquad (5)$$

also becomes small. Specifically, with the resistor Rb connected from the outside of the IC 100, the bias current applied through the resistor R1 to each ECL circuit can be controlled, and a difference $\Delta V$ of the logic states of each ECL circuit can be controlled.

Controlling the difference $\Delta V$, the relation $\Delta Vf > \Delta V$ can be established when the transistor of each ECL circuit has some fault and the voltage at the collector of the transistor is fixed in $Vr - \Delta Vf$, and the fault can be detected by performing a test as mentioned in the description of the Prior Art embodiments. Since this procedure does not need temperature control, outside operation can perform an efficient and stable test of ECL circuits.

SECOND EMBODIMENT

In controlling the difference ΔV, or in controlling the bias current applied to each ECL circuit, a connection of a resistor from the outside is not always unavoidable.

Figure 2:
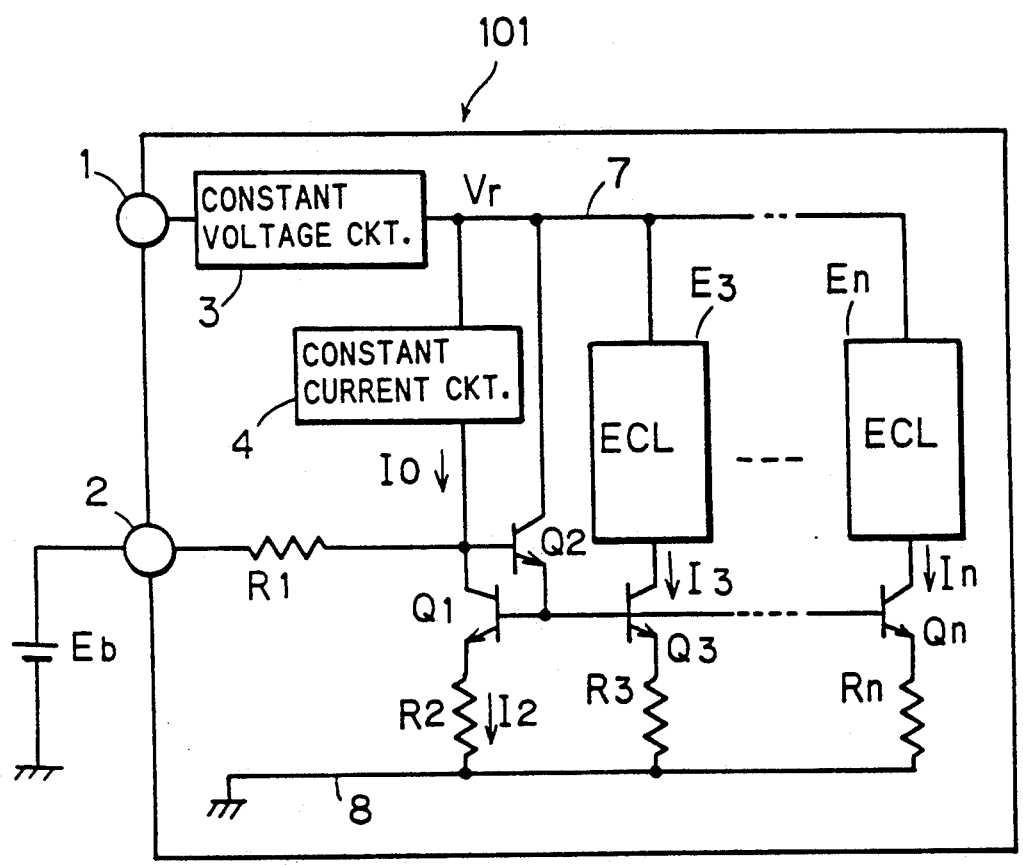
FIG. 2 is a circuit diagram showing a second embodiment according to the present invention.

FIG. 2 shows the relations of a connection when voltage Eb is applied from the outside to the test terminal 2 of the IC 101.

Assuming that a potential at the collector of the transistor Q1 is $V_C$, the current I2 flowing in the resistor R2 is expressed as follows:

$$I2 = I0 + (Eb - V_C)/R1 \qquad (6)$$

Also the bias currents, I3 to In, applied to the ECL circuit, respectively, assume the same value. Thus, applying the voltage Eb from the outside to the test terminal 2, the difference ΔV of the logic states of each ECL circuit can be controlled, and the same effect as in the first embodiment can be attained.

THIRD EMBODIMENT

Figure 3:
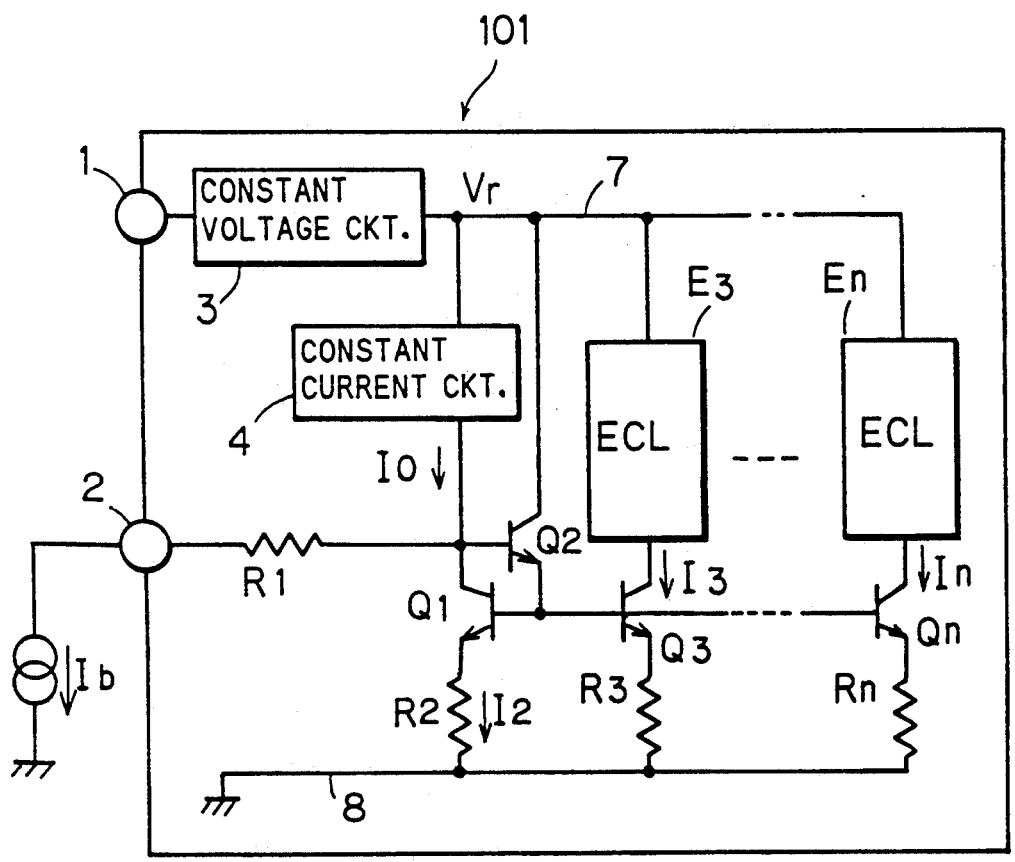
FIG. 3 is a circuit diagram showing a third embodiment according to the present invention.

As shown in FIGS. 1 and 2, controlling the current I2 flowing in the resistor R2, the difference ΔV of the logic states can be consequently controlled. Thus, in the test terminal 2, the current Ib may be pulled out (FIG. 3). At this time, there is a relation as follows:

$$I2 = I0 - Ib \qquad (7)$$

and the same effect as in the first and second embodiments can be attained.

FOURTH EMBODIMENT

The resistor R1 connects the test terminal 2 to the collector of the transistor Q1 in the first to third embodiments. The resistor R1 protects the transistor Q1 and the like from breaking down when a surge is caused in the test terminal 2. Therefore, other ways of the protection can be applied.

Figure 4:
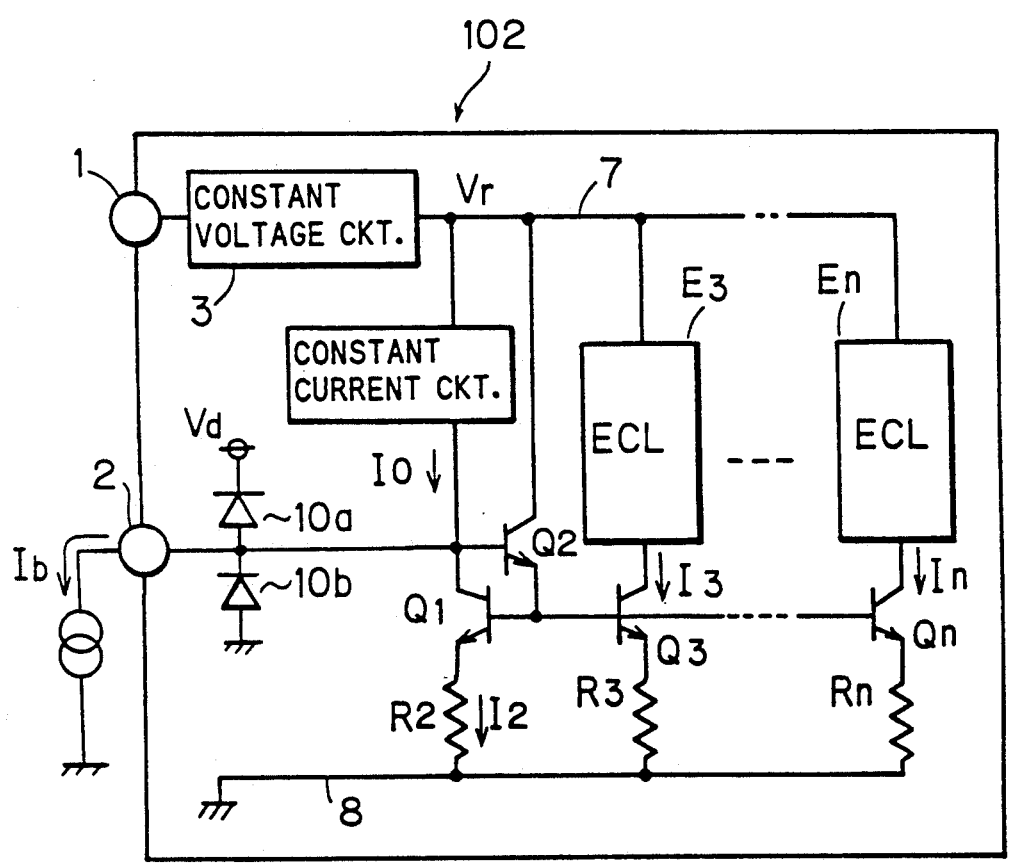
FIG. 4 is a circuit diagram showing a fourth embodiment according to the present invention.

FIG. 4 shows an integrated circuit (IC) 102 in which diodes 10a, 10b are employed as a protective circuit. An anode of the diode 10a and a cathode of the diode 10b are connected to the test terminal 2, and a surge upper voltage limit Vd is applied to a cathode of the diode 10a while a surge lower voltage limit (GND herein) is applied to an anode of the diode 10b. Further, the test terminal 2 is connected to the collector of the transistor Q1.

The IC 102 structured as mentioned above has the test terminal 2 connected to a current source to pull the current Ib out from the test terminal 2. Thus, the same effect as in the third embodiment can be attained.

If there is no necessity for paying regard to a surge, the diodes 10a, 10b are needless.

FIFTH EMBODIMENT

While a resistor or the like connects the test terminal 2 to the collector of the transistor Q1 in the first to fourth embodiments, the resistor can connect the test terminal 2 to the emitter of the transistor Q1 to attain the same effect as in the first to fourth embodiments.

Figure 5:
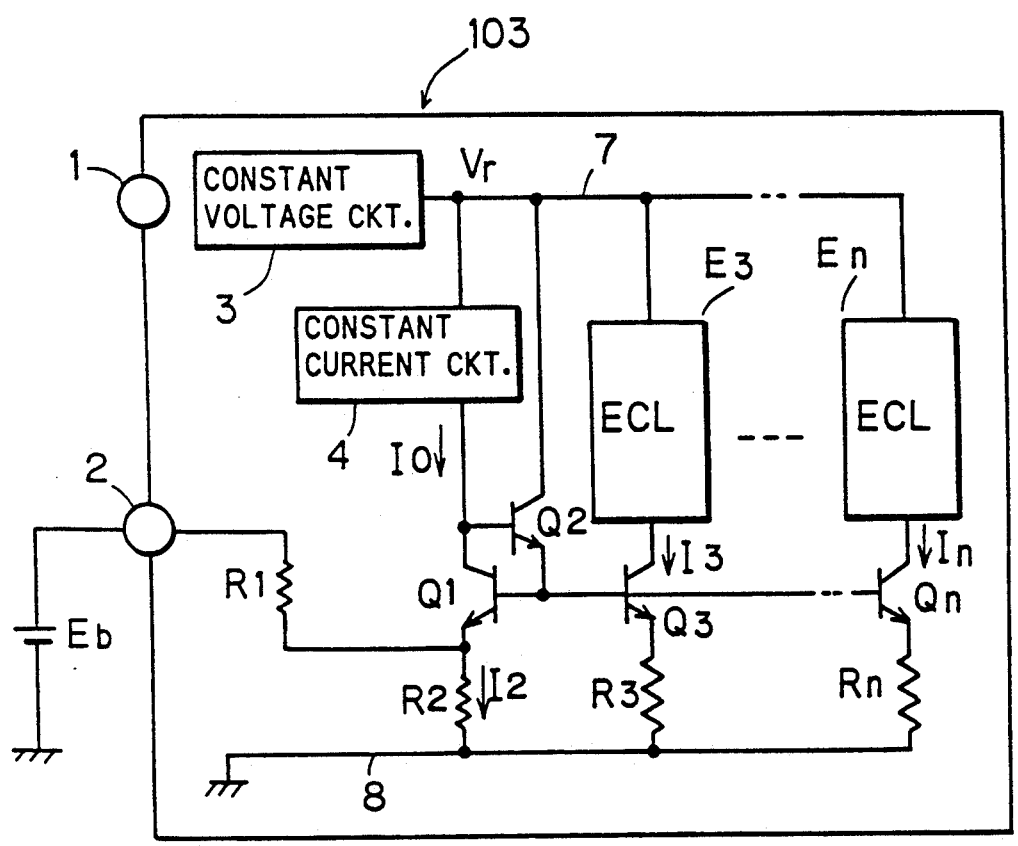
FIG. 5 is a circuit diagram showing a fifth embodiment to the present invention.

FIG. 5 shows an integrated circuit (IC) 103 having a configuration where the resistor R1 connects the emitter of the transistor Q1 to the test terminal 2. The case in which voltage Eb is applied to the test terminal 2 of the IC 103 thus structured will be described.

Voltage at bases of the transistors Q1 and Q3 are expressed commonly as follows:

$$\{I0 - (R2 \times I0 - Eb)/(R1 + R2)\} \times R2 + V_{BE1} = \qquad (8)$$
$$I3 \times R3 + V_{BE3}$$

where $V_{BE1}$ and $V_{BE3}$ denote voltages between the base and emitter of the transistors Q1 and Q3 respectively. Assuming that the transistors Q1 and Q3 are similar in characteristics to each other and that the resistors R2 and R3 are identical in value to each other, both the following formula $$V_{BE} = V_{BE1} = V_{BE3}, R2 = R3 \qquad (9)$$

and the above formula (8) lead to the formula below:

$$I3 = (I0 \times R1 + Eb)/(R1 + R2) \qquad (10)$$

Specifically, with a variation in the voltage Eb, the bias current I3 can be controlled from the outside of the IC 103, and the same effect can be attained as in the first to fourth embodiments.

SIXTH EMBODIMENT

Figure 6:
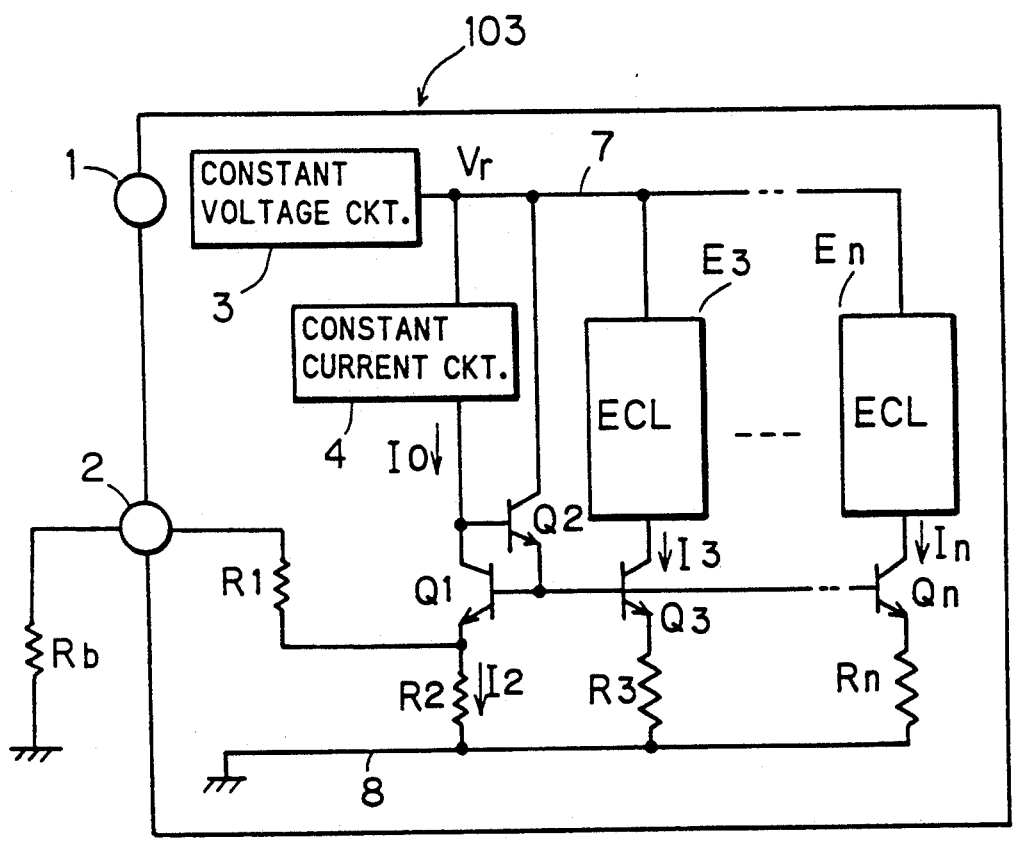
FIG. 6 is a circuit diagram Showing a sixth embodiment to the present invention.

Similar to the first embodiment, the IC 103 shown in the fifth embodiment may have the test terminal 2 connected to the external resistor Rb from the outside. In this case, if the requirements of the formula (9) are satisfied and further the following formula;

$$V_{BE2} \text{ (base - emitter voltage of the transistor } Q2) = V_{BE} \qquad (11)$$

is established, another formula as follows;

$$I3 = I0 - (I0 \times R2 + 2V_{BE})/(R1 + R2 + Rb) \qquad (12)$$

is established and the same effect as in the first embodiment can be attained (FIG. 6).

SEVENTH EMBODIMENT

Figure 7:
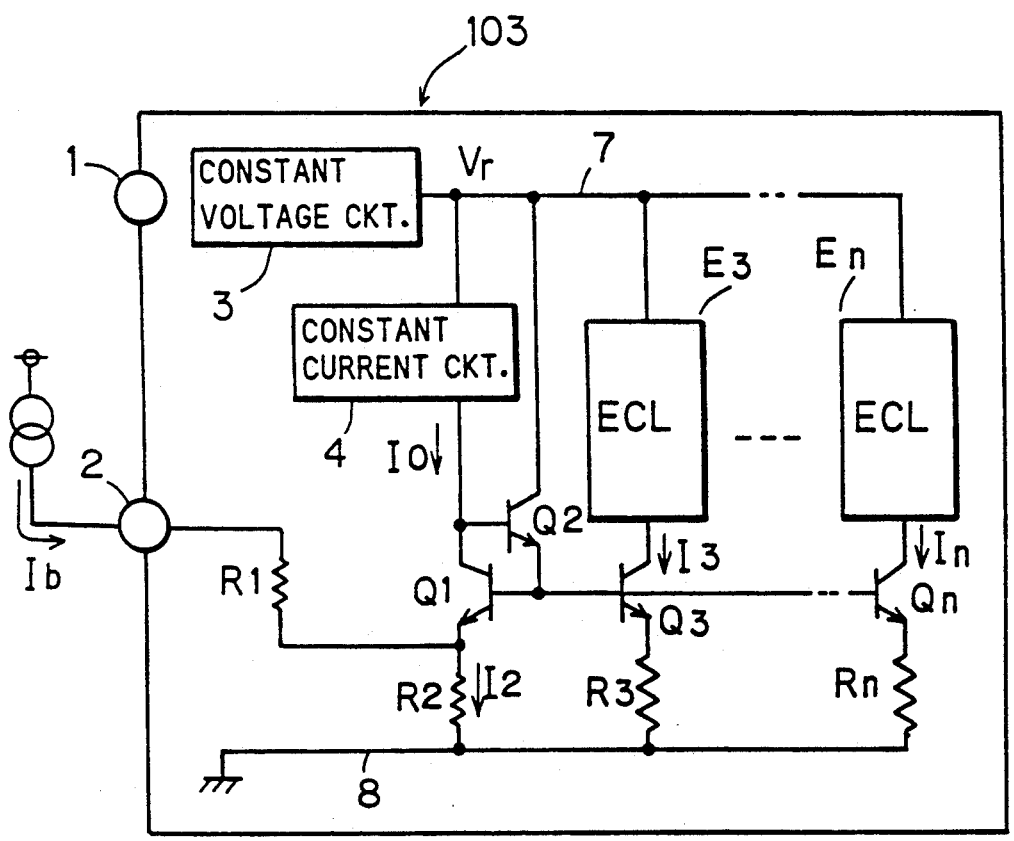
FIG. 7 is a circuit diagram showing a seventh embodiment to the present invention.

The IC 103 can have the test terminal 2 fed with the current Ib from the outside. In this case, if the requirements in the formula (9) are satisfied, the following formula is established;

$$I3 = I0 + Ib \qquad (13)$$

and the same effect as in the third embodiment can be attained (FIG. 7).

While the invention has been shown and described in detail, the foregoing description is in all aspects illustrative and not restrictive. It is therefore understood that numerous modifications and variations can be devised without departing from the scope of the invention.

We claim:

1. A semiconductor integrated circuit, comprising:
   at least one ECL circuit;
   a current supply circuit for supplying bias current to said ECL circuit;
   a constant current means in which constant current for controlling said bias current flows; and
   a test terminal connected to said constant current means for controlling a value of said constant current flowing in said constant current means.

2. A semiconductor integrated circuit according to claim 1, wherein a number of said at least one ECL circuit is two or more.

3. A semiconductor integrated circuit according to claim 1, wherein said constant current means is cooperated with said current supply circuit to organize a current mirror circuit.

4. A semiconductor integrated circuit according to claim 3, wherein said constant current means includes:
a transistor having a first electrode to which a constant current circuit is connected, a second electrode to which a first resistor is connected, and a control electrode to which said current supply circuit is connected.

5. A semiconductor integrated circuit according to claim 4, further comprising a second resistor connected between said test terminal and said first electrode.

6. A semiconductor integrated circuit according to claim 5, wherein said second resistor has a resistance value of zero.

7. A semiconductor integrated circuit according to claim 5, wherein to said test terminal, a voltage source is to be connected from an outside of said semiconductor integrated circuit.

8. A semiconductor integrated circuit according to claim 5, wherein said test terminal is connected to one end of a third resistor, the other end of which is connected to a voltage source.

9. A semiconductor integrated circuit according to claim 5, wherein to said test terminal, a current source is to be connected from an outside of said semiconductor integrated circuit.

10. A semiconductor integrated circuit according to claim 9, further comprising:
a first power source; and
a first protective circuit connected between said first power source and said test terminal.

11. A semiconductor integrated circuit according to claim 10, wherein said first protective circuit includes a diode.

12. A semiconductor integrated circuit according to claim 10, further comprising:
a second power source; and
a second protective circuit connected between said second power source and said test terminal.

13. A semiconductor integrated circuit according to claim 12, wherein said second protective circuit includes a diode.

14. A semiconductor integrated circuit according to claim 4, further comprising a second resistor connected between said test terminal and said second electrode.

15. A semiconductor integrated circuit according to claim 14, wherein to said test terminal, a voltage source is to be connected from an outside of said semiconductor integrated circuit.

16. A semiconductor integrated circuit according to claim 14, wherein said test terminal is connected to one end of a third resistor, the other end of which is connected to a voltage source.

17. A semiconductor integrated circuit according to claim 14, wherein to said test terminal, a current source is to be connected from an outside of said semiconductor integrated circuit.

18. A semiconductor integrated circuit according to claim 3, wherein said current supply circuit includes:
a transistor having a first electrode to which said ECL circuit is connected, a second electrode to which a first resistor is connected, and a control electrode connected to said constant current means.

19. A semiconductor integrated circuit, comprising:
at least one ECL circuit;
a current supply circuit for supplying bias current to said ECL circuit;
a constant current circuit for outputting a constant current signal;
a transistor having a first electrode to which the constant current signal circuit is connected for receiving the constant current from the constant current circuit, a second electrode to which a first resistor is connected, and a control electrode to which said current supply circuit is connected; and
a test terminal connected to said first electrode of the transistor for varying a value of said bias current supplied by the current supply circuit.

20. The semiconductor integrated circuit according to claim 19, wherein a number of said at least one ECL circuit is two or more.

21. The semiconductor integrated circuit according to claim 19, further comprising a second resistor connected between said test terminal and said first electrode of the transistor.

22. The semiconductor integrated circuit according to claim 21, wherein said second resistor has a resistance value of zero.

23. The semiconductor integrated circuit according to claim 21, further comprising a voltage source connected to said test terminal from an outside of said semiconductor integrated circuit.

24. The semiconductor integrated circuit according to claim 21, further comprising a third resistor connected between ground and said test terminal.

25. The semiconductor integrated circuit according to claim 21, further comprising a current source connected to said test terminal from an outside of said semiconductor integrated circuit.

26. The semiconductor integrated circuit according to claim 25, further comprising:
a first power source; and
a first protective circuit connected between said first power source and said test terminal.

27. The semiconductor integrated circuit according to claim 26, wherein said first protective circuit comprises a diode.

28. The semiconductor integrated circuit according to claim 26, further comprising:
a second protective circuit connected between ground and said test terminal.

29. The semiconductor integrated circuit according to claim 28, wherein said second protective circuit comprises a diode.

30. The semiconductor integrated circuit according to claim 19, further comprising a second resistor connected between said test terminal and said second electrode of the transistor.

31. The semiconductor integrated circuit according to claim 30, further comprising a voltage source connected to said test terminal from an outside of said semiconductor integrated circuit.

32. The semiconductor integrated circuit according to claim 30, further comprising a third resistor connected between ground and the test terminal.

33. The semiconductor integrated circuit according to claim 30, further comprising a current source connected to said test terminal from an outside of said semiconductor integrated circuit.

* * * * *